United States Patent [19]

Teague

[11] Patent Number: 4,754,227
[45] Date of Patent: Jun. 28, 1988

[54] RECIRCULATING BROADBAND LOOP WITH TUNABLE BANDPASS FILTER

[75] Inventor: Randy Teague, Syosset, N.Y.

[73] Assignee: General Instrument Corp., New York, N.Y.

[21] Appl. No.: 931,209

[22] Filed: Nov. 17, 1986

[51] Int. Cl.⁴ .............................................. H03B 1/04
[52] U.S. Cl. .................................... 328/167; 328/140; 333/173; 307/546; 307/556; 307/522
[58] Field of Search ........................ 328/140, 138, 167; 333/173, 171; 307/54 B, 546, 549, 556, 520, 522, 296.4

[56] References Cited

U.S. PATENT DOCUMENTS

| | | | |
|---|---|---|---|
| 3,314,026 | 4/1967 | Maynard | 307/520 |
| 3,714,588 | 1/1973 | Deboo et al. | 328/167 |
| 4,322,441 | 3/1982 | Packard | 307/521 |

Primary Examiner—Stanley D. Miller
Assistant Examiner—Richard Roseen
Attorney, Agent, or Firm—James & Franklin

[57] ABSTRACT

Recirculation is prolonged in a broadband microwave loop by flattening the overall frequency response of the loop. A bandpass filter, tuned to the input signal frequency, is placed in the loop after the broadband amplifier. A frequency discriminator responsive to the input signal controls the filter driver.

10 Claims, 1 Drawing Sheet

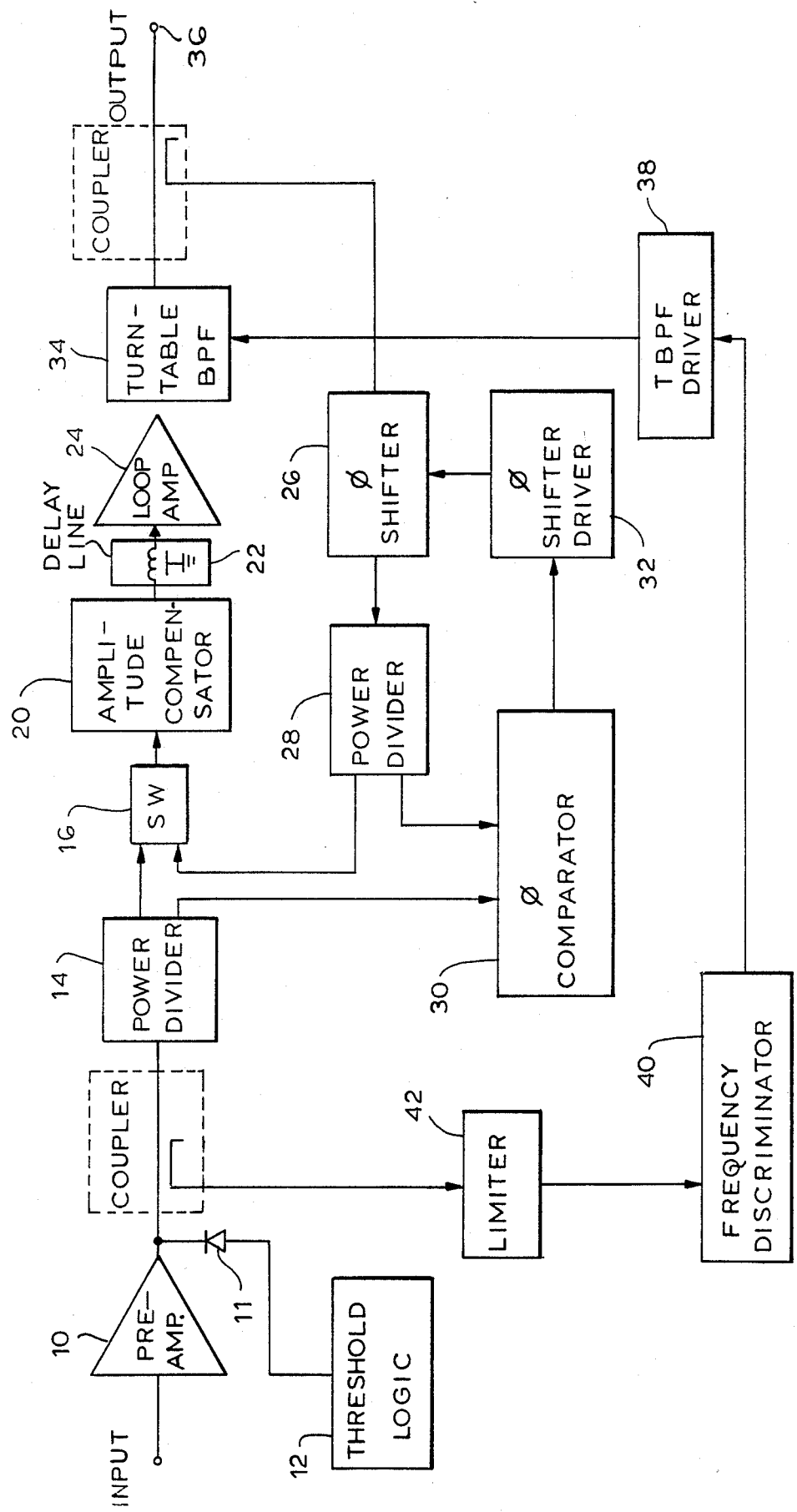

RECIRCULATING BROADBAND LOOP WITH TUNABLE BANDPASS FILTER

The present invention relates to a broadband microwave recirculation loop and, more particularly, to a broadband microwave recirculation loop which employs a tunable bandpass filter to prolong recirculation by flattening the overall frequency response of the loop.

Broadband microwave recirculation loops are used in a variety of applications, such as repeater/jammer radars and the formation of electronic counter measure decoys. The present invention relates to a broadband microwave recirculation loop which has improved characteristics which make it less subject to oscillations, and which requiresless expensive amplifiers and less tuning.

Narrow band microwave recirculation loops are known in the art. Such circuits include a preamplifier which receives the input signal and determines the system sensitivity. The output of the amplifier is connected to a threshold detector. Preamplifier output, if it has sufficient gain to trip a threshold detector, is applied to the input of a high speed switch. After a set amount of time (in the nano second range), the switch changes state to close the recirculation loop. Once closed, microwave energy recirculates in the loop which includes a delay line and a narrow band amplifier.

The narrow band amplifier has enough gain to provide a positive loop gain and a saturation signal on each recirculation. A phase trimmer coupled to the output of the amplifier is adjusted so that each circulation will be in phase (or nearly in a phase) with the previous circulation. This provides signal coherency and maximum output power. The coupler allows the recirculations to be continuously sampled at the amplifier output.

In addition to the signal, noise also recirculates in the loop. At some point in time, the noise has grown enough to create an oscillation at a "preferred" frequency and overcomes the recirculating signal. This preferred frequency is usually the frequency that has the highest gain and proper phasing.

For a narrow band loop that has a very flat overall loop gain, thirty or more recirculations can occur before oscillation at the preferred frequency begins. Not only does the oscillation present an undesirable signal at the output, it also eliminates the input signal. Accordingly, the most important specification for a narrow band recirculation loop is the loop gain flatness (or ripple).

Broadband microwave recirculation loops are also known in the art. Such loops perform the same function as the narrow band loop, but may operate over a bandwidth of an octave or more. In the broadband loop, the loop amplifier is a broadband amplifier and components are added to provide phase compensation over the wide bandwidth. A phase shifter is used to match the phase of the recirculating signal with the phase of the input signal. It may take a couple of recirculations to perform phase matching, but same will provide coherency in the output signal.

Broadband amplifiers inherently have considerably more ripple than narrow band amplifiers. This characteristic prevents the overall loop gain of a broadband loop from being very flat. The larger the difference in loop gain at the input frequencies and preferred frequencies (approximately maximum gain), the sooner oscillation will occur. In a typical system, oscillation may occur after only seven recirculations.

The amplifier and the rest of the loop components cannot maintain extremely flat loop gain over large bandwidths. One way to solve this problem is to add an amplitude equalizer. However, such components can be large, extremely complicated, and each system requires a custom equalizer. The present invention overcomes the oscillation problem in broadband loops and, hence, prolongs recirculations, by reducing the number of gain peaks and forcing the loop gains at the input frequency and the preferred frequencies to be nearly equal. This is accomplished without the necessity for an amplitude equalizer.

It is, therefore, a prime object of the present invention to provide a recirculating broadband microwave loop with tunable bandpass filter which prolongs recirculations.

It is another object of the present invention to provide a recirculating broadband loop with tunable bandpass filter in which the number of gain peaks are reduced.

It is another object of the present invention to provide a recirculating broadband loop with tunable bandpass filter in which the loop gains at the input frequency and the preferred frequencies are nearly equal.

It is another object of the present invention to provide a recirculating broadband loop with tunable bandpass filter which has a flattened overall loop gain.

In accordance with the present invention, a broadband microwave circuit is provided for recirculating an input signal. The circuit is of the type comprising high speed switch means for applying either the input signal or a recirculated signal to a broadband amplifier through delay means. The circuit output receives the amplifier output and is coupled to the switch means through phase adjusting means to form the recirculating loop. The circuit is improved by adding filter means responsive to the input signal frequency in the loop. The filter means flattens the overall frequency response of the recirculating loop.

The filter means comprises a tunable bandpass filter and means for tuning the filter. The filter tuning means comprises a driver operably connected to the filter and a frequency discriminator responsive to the input signal and operably connected to the driver.

The phase adjusting means comprises phase shifter means, phase shifter driver means, and phase comparator means.

A first power divider means is provided for dividing the input signal between the switch means and the phase comparator. A second power divider means is provided for dividing the output of the phase shifter between the shift means and the phase comparator.

Means are provided for preamplifying the input signal. Means are also provided for measuring the threshold level of the input signal.

To these and to such other objects which may hereinafter occur, the present invention relates to a recirculating broadband loop with tunable bandpass filter, as described in the following specification and recited in the annexed claims, taken together with the accompanying drawing, which is a schematic representation of the recirculating band loop with the tunable bandpass filter of the present invention.

The sole figure shows the preferred embodiment of the invention. As shown in the drawing, the input signal is received by a preamplifier 10 which determines the system sensitivity. The output of preamplifier 10 is connected through a detector 11 to a threshold logic circuit 12. If the gain of the preamplifier output is sufficient, the output is received at the input of a first power divider 14. One output of divider 14 forms an input for a single pole, double throw, high-speed switch 16. The output of switch 16 forms the input to an amplitude compensation circuit 20 which corrects for the loss slope in a delay line 22, over the operating bandwidth. The output of delay line 22 provides the input for a broadband amplifier 24.

In the conventional circuit, the output of amplifier 24 forms the circuit output at node 36, which is sampled. The input of a frequency shifter circuit 26 is coupled to the output of amplifier 24. The output of circuit 26 forms the input of a second power divider circuit 28. One output of power divider circuit 28 forms the second input to switch 16 and completes the loop. The other output of power divider 28 forms one of the inputs to a phase comparator circuit 30, the other input of which is the second output of power divider circuit 14. The output of phase comparator circuit 30 forms the control input to a phase shifter driver 32 which, in turn, controls phase shifter circuit 26. The above described components make up a conventional broadband microwave recirculating loop.

The present invention is an improvement on the conventional circuit which functions to prolong recirculations by reducing the number of gain peaks and forcing the loop gains at the input frequency and the preferred frequencies to be nearly equal. This is achieved through the use of a tunable bandpass filter 34 which is interposed between the output of amplifier 24 and the circuit output 36, prior to the point where phase shifter 26 is coupled. Filter 34 is tuned by a driver circuit 38 which, in turn, is fed from a frequency discriminator circuit 40. Limiter 42 is coupled to the output of preamplifier 10 and functions to insure that the power input to the discriminator is always constant.

The output of the frequency discriminator circuit 40 is applied to the tunable filter driver 38 which electronically tunes filter 34 to or near the frequency of the input signal. Filter 34 must be set before the input signal reaches it. Thus, the discriminator 40 and driver 38 must perform in a time period which is less then the delay time of the delay line 22. This is typically 80-100 nanoseconds. If more time is required, a second delay line can be added to the loop.

With the improvement of the present invention, the circuit can operate over a wide frequency range, but have the gain characteristics of a narrow band loop. Thus, the circuit has all of the advantages of a narrow band loop, that is, many recirculations before oscillation, but operates over a wide bandwidth.

The simplicity or the complexity of the components is dictated by the requirements of the system. The frequency discriminator can be as simple as a delay line discriminator or as complex as an instantaneous frequency measurement circuit. The tunable bandpass filter can be a varactor tuned filter to meet tuning speed requirements. The skirts of the filter need only be steep enough to overcome ripple away from the input frequency. The bandwidth of the filter should be large enough to accommodate any error in the frequency discriminator and filter driver. This means the filter need not tune exactly to the input frequency but should be close enough so that the difference in the amplitude between gain and input frequency gain is less than the specified amount. This amount is determined by the number of recirculations required before oscillation begins.

Some other electronics of a conventional nature may be used in conjunction with the filter to keep the filter tuned until the system begins receiving again. A microwave switch interposed before the frequency discriminator or an electronic switch between the driver and filter could be used to inhibit operation of the discriminator so as to maintain the filter setting until each new input signal is received. This allows the phase compensation to retain its accuracy.

It should be noted that a side advantage of the present invention is that the second harmonic of the amplifier is attenuated. Second harmonics can cause problems when applied to the input of the travelling wave tubes in repeater applications.

While only a single preferred embodiment of the present invention has been disclosed herein for purposes of illustration, it is obvious that many variations and modifications could be made thereto. It is intended to cover all of these variations and modifications which fall within the scope of the present invention, as defined by the following claims:

I claim:

1. In a broad band microwave loop circuit for recirculating an input signal, the circuit being of the type comprising high speed switch means for applying either the input signal or recirculated signal to a broad band amplifier through delay means, the circuit output receiving the amplifier output and being coupled to the switch means through phase adjusting means to form a recirculating loop, the improvement comprising tunable filter means operably connected in the loop between said broad band amplifier and said phase adjusting means, and means for sensing the frequency of the input signal and for tuning said filter means in response thereto.

2. The circuit of claim 1, wherein said filter means comprises a tunable bandpass filter and.

3. The circuit of claim 2, wherein said means for sensing and typing comprises a driver operably connected to said filter means and a frequency discriminator responsive to the input signal and operably connected to said driver.

4. The circuit of claim 3 further comprising means connected to the input of said frequency discriminator for preventing power fluctuations in the input signal to said frequency discriminator.

5. The circuit of claim 1 wherein said phase adjusting means comprises phase shifter means operably connected between the circuit output and the input of high speed switch means, phase shifter driver means operably connected to drive said phase shifter means and phase comparator means operably connected to receive said input signal and to control said phase shifter driver means.

6. The circuit of claim 5, further comprising first means for dividing the input signal between the switch means and the phase comparator and second means for dividing the output of the phase shifter means between the switch means and the phase comparator.

7. The circuit of claim 1, further comprising means for preamplifying the input signal, said preamplifying means being operably connected to the input of said switch means.

8. The circuit of claim 1, further comprising means for measuring the level of the input signal.

9. The circuit of claim 1, wherein said said tunable filter means is operably connected to said loop between the output of said amplifier and the circuit output.

10. In the broad band microwave loop circuit for recirculating an input signal, the circuit being of the type comprising high speed switch means having first and second inputs and an output, said first input being operably connected to receive the input signal, said second input being operably connected to receive a recirculating signal and said output being operably connected to a broad band amplifier through delay means, the circuit output receiving the amplifier output and being coupled to said second input of said switch means through phase adjusting means to form a recirculating loop, the improvement comprising tunable filter means, operably connected in said loop between said delay means and said second input of said switch means, and means for sensing the frequency of the input signal and for tuning said filter means in response thereto.

* * * * *